United States Patent
Caudillo et al.

(10) Patent No.: US 10,186,582 B2
(45) Date of Patent: Jan. 22, 2019

(54) GRAPHENE FLUORINATION FOR INTEGRATION OF GRAPHENE WITH INSULATORS AND DEVICES

(71) Applicant: Intel Corporation, Santa Clara, CA (US)

(72) Inventors: Roman Caudillo, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 15/123,242

(22) PCT Filed: Jun. 13, 2014

(86) PCT No.: PCT/US2014/042395
§ 371 (c)(1),
(2) Date: Sep. 1, 2016

(87) PCT Pub. No.: WO2015/191089
PCT Pub. Date: Dec. 17, 2015

(65) Prior Publication Data
US 2017/0077235 A1    Mar. 16, 2017

(51) Int. Cl.
*H01L 29/16* (2006.01)
*H01L 21/02* (2006.01)
(Continued)

(52) U.S. Cl.
CPC .......... *H01L 29/1606* (2013.01); *B82Y 25/00* (2013.01); *H01L 21/0262* (2013.01);
(Continued)

(58) Field of Classification Search
CPC ............... H01L 21/02518; H01L 21/04; H01L 21/0405; H01L 21/0425; H01L 21/044; H01L 21/4814; H01L 29/68
See application file for complete search history.

(56) References Cited

U.S. PATENT DOCUMENTS

2012/0085991 A1    4/2012    Cohen et al.
2013/0001515 A1    1/2013    Li et al.
(Continued)

FOREIGN PATENT DOCUMENTS

CN    103579310 A    2/2014
EP    2960664 A1    1/2014
(Continued)

OTHER PUBLICATIONS

International Search Report and Written Opinion dated Feb. 27, 2015, issued in International Application No. PCT/US2014/042395, 14 pages.
(Continued)

*Primary Examiner* — Cheung Lee
(74) *Attorney, Agent, or Firm* — Schwabe, Williamson & Wyatt, P.C.

(57) ABSTRACT

Embodiments of the present disclosure describe multi-layer graphene assemblies including a layer of fluorinated graphene, dies and systems containing such structures, as well as methods of fabrication. The fluorinated graphene provides an insulating interface to other graphene layers while maintaining the desirable characteristics of the nonfluorinated graphene layers. The assemblies provide new options for utilizing graphene in integrated circuit devices and interfacing graphene with other materials. Other embodiments may be described and/or claimed.

18 Claims, 9 Drawing Sheets

(51) Int. Cl.
  *H01L 23/29* (2006.01)
  *B82Y 25/00* (2011.01)
  *H01L 21/04* (2006.01)
  *H01L 23/532* (2006.01)
  *H01L 27/088* (2006.01)
  *H01L 29/49* (2006.01)
  *H01L 29/51* (2006.01)
  *H01L 29/786* (2006.01)
  *B82Y 30/00* (2011.01)

(52) U.S. Cl.
  CPC .. *H01L 21/02115* (2013.01); *H01L 21/02227* (2013.01); *H01L 21/02527* (2013.01); *H01L 21/044* (2013.01); *H01L 21/0405* (2013.01); *H01L 23/29* (2013.01); *H01L 23/5329* (2013.01); *H01L 23/53276* (2013.01); *H01L 27/088* (2013.01); *H01L 29/4908* (2013.01); *H01L 29/51* (2013.01); *H01L 29/78684* (2013.01); *B82Y 30/00* (2013.01); *H01L 2224/16225* (2013.01); *H01L 2924/15311* (2013.01)

(56) References Cited

U.S. PATENT DOCUMENTS

| | | |
|---|---|---|
| 2013/0001519 A1 | 1/2013 | Chen et al. |
| 2013/0022813 A1 | 1/2013 | Tang et al. |
| 2013/0082235 A1 | 4/2013 | Gu et al. |
| 2013/0313522 A1 | 11/2013 | Nourbakhsh et al. |
| 2014/0021446 A1 | 1/2014 | Lee et al. |
| 2014/0291819 A1* | 10/2014 | Barth ................ H01L 23/53276 257/659 |

FOREIGN PATENT DOCUMENTS

| | | |
|---|---|---|
| JP | 2013236017 A | 11/2013 |
| WO | WO201105865 A1 | 3/2013 |

OTHER PUBLICATIONS

Taiwan Office Action and Search Report dated Aug. 5, 2016, issued in corresponding Taiwan Patent Application No. 104114300.

International Preliminary Report on Patentability dated Dec. 22, 2016, issued in International Application No. PCT/US2014/042395, 11 pages.

Office Action dated Jun. 18, 2018 for Japanese Patent Application No. 2016-566738, 9 pages.

* cited by examiner

GRAPHENE FLUORINATION FOR INTEGRATION OF GRAPHENE WITH INSULATORS AND DEVICES

CROSS-REFERENCE TO RELATED APPLICATION

The present application is a national phase entry under 35 U.S.C. § 371 of International Application No. PCT/US2014/042395, filed Jun. 13, 2014, entitled "GRAPHENE FLUORINATION FOR INTEGRATION OF GRAPHENE WITH INSULATORS AND DEVICES," which designates the United States of America, the entire disclosure of which is hereby incorporated by reference in its entirety and all purposes.

FIELD

Embodiments of the present disclosure generally relate to the field of integrated circuits, and more particularly, to multi-layer graphene structures including fluorinated graphene for use in integrated circuit devices, dies and systems incorporating the multi-layer graphene structures and methods for forming such structures and devices.

BACKGROUND

Graphene is a high interest material because it exhibits high-mobility potential and naturally thin body geometry. Typically, however, it has been difficult to interface graphene with insulators for use in integrated circuit (IC) devices without significant decreases to the graphene's conductance and mobility. Fluorination has been shown to significantly increase the resistivity of graphene and convert it into an insulator but has not been able to solve the issue of placing a high quality interface insulator on graphene while maintaining the beneficial conductance and mobility characteristics of the graphene.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
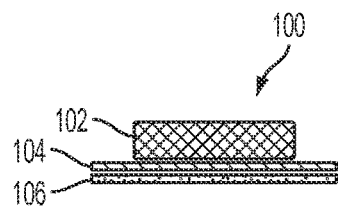
FIGS. 1A-E schematically illustrate cross-section side views of different graphene assemblies, in accordance with some embodiments.

Embodiments of the present disclosure include multi-layer graphene assemblies including fluorinated graphene, dies and systems incorporating such assemblies, and methods for forming graphene assemblies. The use of multi-layer assemblies with at least one fluorinated graphene layer allows the graphene to be interfaced with other materials and used in IC devices without degradation of its conductance or high mobility. The fluorinated graphene layer/s provide an insulative interface to the other graphene layers, which maintain their desirable conductance and mobility performance. Numerous implementations of the multi-layer graphene assemblies are disclosed.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SOC), a processor (shared, dedicated, or group) and/or memory (shared, dedicated, or group) that execute one or more software or firmware programs, a combinational logic circuit, and/or other suitable components that provide the described functionality.

FIGS. 1A-E illustrate cross-section side views of different graphene assemblies, in accordance with some embodiments. In each assembly, one or more layers of fluorinated graphene may be used as a dielectric material or tunnel barrier for a charge or spin-based device (such as a transistor or non-local spin valve). Additionally, each assembly may include one or more layers of nonfluorinated graphene which can be used to conduct a charge or spin current. Throughout the figures small spaces have been included to clarify the different layers. In practice the layers may be in contact with one another and the figures should be considered as showing a slightly exploded view of the cross-sections in some instances in order to more easily identify and label the different layers (in particular where multiple layers of the same material are disposed adjacent to one another). Unless noted otherwise, any gaps between the layers are included for these purposed and not intended to represent gaps or spaces in the final assemblies.

FIG. 1A illustrates an assembly 100 which may include a layer 106 of nonfluorinated graphene that may retain its conductive properties and thus be useful for conducting an electrical charge or spin current and layer 104 of fluorinated graphene that is insulating and may serve as the dielectric material for a field-effect gate. A gate 102 may be formed on layer 104 of fluorinated graphene. The gate electrode material may be composed of any suitable electrically conductive material including, for example, one or more metals such as, for example, workfunction metals. Layer 104 of fluorinated graphene may allow the gate to be formed without decreasing the conductive characteristics of layer 106 of nonfluorinated graphene. In this manner, it may be possible to interface graphene with materials, and incorporate graphene into devices, while maintaining the desired electrical conductivity of the nonfluorinated graphene layers by using one or more fluorinated graphene layers as an interface. Furthermore, a fluorinated graphene layer may provide a pin-hole free dielectric material and/or interface that is atomically thin and that circumvents typical issues encountered in depositing a pin-hole free high-quality dielectric on graphene.

Figure 1B:
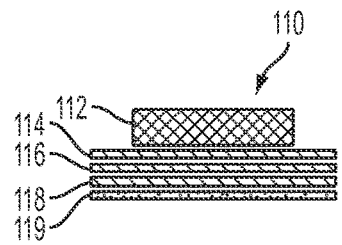

FIG. 1B shows another assembly 110. Assembly 110 may include a nonfluorinated graphene layer 119. Nonfluorinated graphene layer 119 may retain its conductive properties and thus be useful for conducting an electrical charge or spin current. The assembly 110 may further include multiple layers of fluorinated graphene 114, 116, 118. Layers 114, 116, 118 may be individually deposited and fluorinated or separately fluorinated and subsequently coupled as is discussed in more detail with respect to FIGS. 6-8 below. The assembly 110 may further include a gate 112. The gate 112 may be similar to gate 102 discussed above.

Figure 1C:
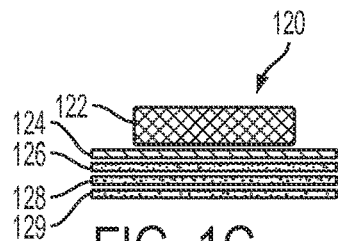

FIG. 1C shows an assembly 120. Assembly 120 may include three nonfluorinated graphene layers 129, 128, 126. Nonfluorinated graphene layers 129, 128, 126 may retain their conductive properties and thus be useful for conducting an electrical charge or spin current. The presence of additional nonfluorinated graphene layers, as compared with the previous embodiments, may increase the charge or spin carrying capacity of the assembly. The assembly 120 may further include a layer of fluorinated graphene 124. The assembly 120 may further include a gate 122. The gate 122 may be similar to gate 102 discussed above.

Figure 1D:
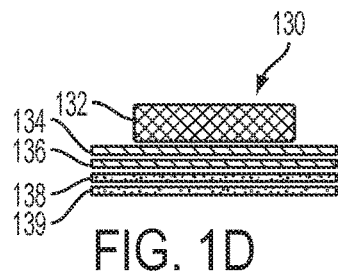

FIG. 1D shows an assembly 130. Assembly 130 may include two nonfluorinated graphene layers 139, 138. Nonfluorinated graphene layers 139, 138 may retain their conductive properties and thus be useful for conducting an electrical charge or spin current. The presence of additional nonfluorinated graphene layers, as compared with some previous embodiments, may increase the charge carrying capacity of the assembly. The assembly 130 may further include two layers of fluorinated graphene 136, 134. The assembly 130 may further include a gate 132. The gate 132 may be similar to gate 102 discussed above. Although two nonfluorinated graphene layers 139, 138 are shown, additional nonfluorinated graphene layers may be included.

Figure 1E:
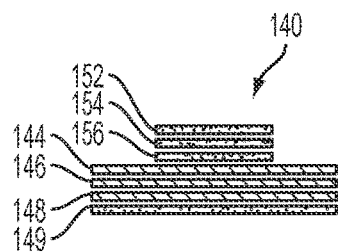

FIG. 1E shows an assembly 140. Assembly 140 may include a nonfluorinated graphene layer 149. Nonfluorinated graphene layer 149 may retain its conductive properties and thus be useful for conducting an electrical charge or spin current. The assembly 140 may further include three layers of fluorinated graphene 148, 146, 144. The assembly 140 may further include a gate. Unlike the gates discussed above, the gate may be formed of one or more layers of nonfluorinated graphene. In this instance three layers 152, 154, 156 are shown, but fewer or more layers may be utilized. In this manner, it may be possible to form a vertical tunneling field effect transistor (FET) from graphene whereby tunneling current may be modulated by adjusting the carrier density or either or both of nonfluorinated graphene layer 149 or the graphene gate (including layers 152, 154, 156 in this instance) by adjusting the carrier concentration either electrostatically with another gate (not shown) or chemically. Although, shown in a particular arrangement a gate formed from one or more graphene layers may be incorporated into any number of assemblies, including but not limited to assemblies 100, 110, 120, 130. Furthermore other assembly configurations are possible, including assemblies with more or fewer graphene (both fluorinated and nonfluorinated) layers than those specifically shown and discussed. Nonfluorinated graphene layer 149 may be formed on, or coupled to, a substrate or another layer of a die during a die fabrication process.

Figure 2A:
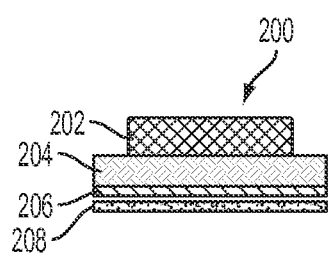
FIGS. 2A-B schematically illustrate cross-section side views of graphene assemblies incorporating other dielectric materials, in accordance with some embodiments.
Figure 2B:
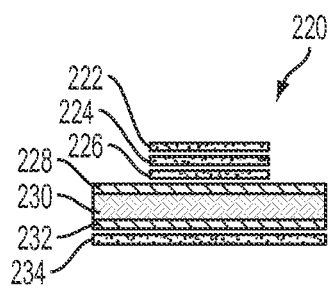

FIGS. 2A-B illustrate cross-section side views of graphene assemblies incorporating other dielectric materials, in accordance with some embodiments. In these embodiments, the fluorinated graphene layers may be utilized to interface nonfluorinated graphene layers with other dielectric materials while maintaining the desirable conductive characteristics of the nonfluorinated graphene layers.

FIG. 2A shows an assembly 200. The assembly 200 may include a nonfluorinated graphene layer 208. As discussed above, the nonfluorinated graphene layer 208 may be used to carry an electrical charge or spin current. Although shown as a single nonfluorinated graphene layer 208, additional nonfluorinated graphene layers may be included in some embodiments, for instance to increase the charge or spin carrying capacity of the assembly 200. The assembly 200 may further include a fluorinated graphene layer 206. The fluorinated graphene layer 206 may act as an interface between the nonfluorinated graphene layer 208 and a dielectric material 204. According to various embodiments, the dielectric material 204 may be a gate dielectric formed of a material such as silicon dioxide ($SiO_2$) or a high-k material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The assembly 200 may also contain a gate 202. The gate 202 may be similar to gate 102 and formed from a gate electrode material as discussed above. Alternatively, the gate 202 may be formed from one or more layers of nonfluorinated graphene as discussed previously and shown in FIG. 2B. Providing the fluorinated graphene layer 206 may thus allow numerous other dielectric materials to be utilized while maintaining the conductive characteristics of the nonfluorinated graphene layer 208. Furthermore, a fluorinated graphene layer may provide a pin-hole free interface that is atomically thin and that circumvents typical issues encountered in depositing high-quality dielectric materials on graphene FIG. 2B shows an assembly 220. The assembly 220 is may be similar to assembly 200, but in this instance is shown with a gate formed from three layers 222, 224, 226 of nonfluorinated graphene. As such, an additional layer of fluorinated graphene 228 may be included to serve as an interface between the gate (in particular layer 226) and a dielectric material 230. Similar to assembly 200, assembly 220 may include a nonfluorinated graphene layer 234. As discussed above, the nonfluorinated graphene layer 234 may be used to carry an electrical charge or spin current. Although shown as a single nonfluorinated graphene layer 234, additional nonfluorinated graphene layers may be included in some embodiments, for instance to increase the charge or spin carrying capacity of the assembly 220. The assembly 220 may further include a fluorinated graphene layer 232. The fluorinated graphene layer 232 may act as an interface between the nonfluorinated graphene layer 234 and a dielectric material 230. The dielectric material 230 may be similar to the dielectric material 204 discussed above. Thus it may be possible to utilize a gate formed from one or more layers of nonfluorinated graphene by including a layer of fluorinated graphene as an interface between the gate and a dielectric material. While specific arrangements are shown, other variations are possible including additional layers of fluorinated or nonfluorinated graphene.

Figure 3A:
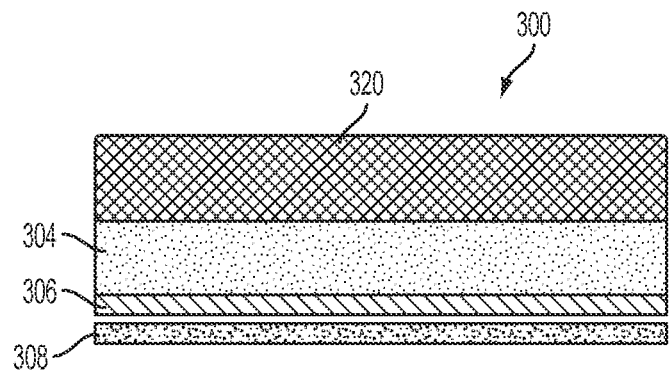
FIGS. 3A-B schematically illustrate cross-section side views of graphene assemblies for use in channel or interconnect structures, in accordance with some embodiments.
Figure 3B:
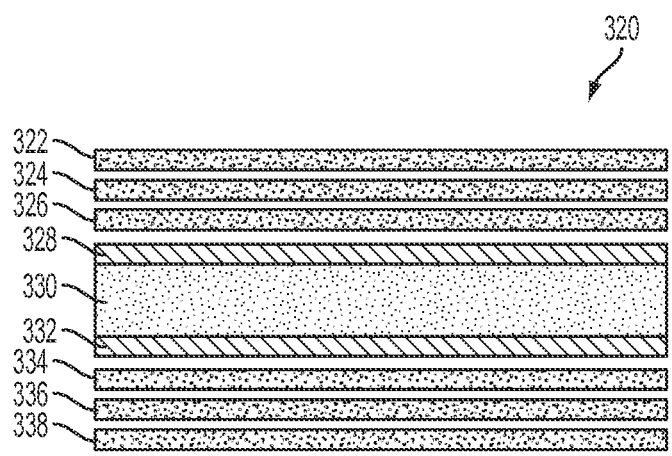

FIGS. 3A-B illustrate cross-section side views of graphene assemblies for use in channel or interconnect structures. FIG. 3A shows an assembly 300. Assembly 300 may include a nonfluorinated graphene layer 308. The nonfluorinated graphene layer 308 may serve as a channel or interconnect in some embodiments. Although a single non-fluorinated graphene layer 308 is shown, multiple layers of nonfluorinated graphene may be included as discussed previously. Assembly 300 may further include a fluorinated graphene layer 306. The fluorinated graphene layer 306 may be disposed on the nonfluorinated graphene layer 308. The fluorinated graphene layer 306 may provide an interface between the nonfluorinated graphene layer 308 and a dielectric material 304. In some embodiments, the dielectric material may include $SiO2$ with or without fluorine and/or carbon doping for lowering the dielectric constant. In addition, the low-k interconnect dielectric may be porous, with different degrees of porosity to lower the dielectric constant. The pores may be ordered or disordered and may consist of a low-k porogen or air. In the instance of 100% porosity, the low-k dielectric material may consist of air in an implementation commonly referred to as Air Gap. The dielectric material 304 may help prevent cross-talk or capacitance issues between adjacent charge carrying components, such as adjacent interconnect structures. The assembly 300 may further include an interconnect 320. The interconnect 320 may be formed from conductive material, for example a metal or nonfluorinated graphene, to route electrical signals as discussed in more detail below. Thus, in some embodiments the use of a fluorinated graphene layer (e.g., 306) may allow nonfluorinated graphene to be utilized in interconnect structure and interfaced with other interconnect materials including dielectrics (e.g., 304) and other conductive interconnect structures, such as other metals or other nonfluorinated graphene interconnects(e.g., 320).

FIG. 3B shows an assembly 320. Assembly 320 shows two multilayer nonfluorinated graphene structures which may be separated by a combination of fluorinated graphene and a dielectric material. In this manner it may be possible to use graphene as the primary conductor in an interconnect arrangement. Assembly 320 may include multiple nonfluorinated graphene layers 338, 336, 334. As discussed previously, using multiple layers may increase the charge or spin carrying capacity. The nonfluorinated graphene layers 338, 336, 334 may serve as a channel or interconnect. The assembly 320 may further include a fluorinated graphene layer 332. The fluorinated graphene layer 332 may serve as an interface between the nonfluorinated graphene layers 338, 336, 334 and a dielectric material 330. The dielectric material 330 may be similar to dielectric material 304 discussed above in regards to FIG. 3A. A second fluorinated graphene layer 326 may be included to interface between the dielectric material 328 and additional nonfluorinated graphene layers on the other side of the dielectric material 328. Additional nonfluorinated graphene layers 326, 324, 322 may be included to form an additional interconnect structure. Thus, in some embodiments graphene interconnects may be separated from one another by dielectric material 304 with an interface layer of fluorinated graphene (333, 328) between the dielectric material 304 and the nonfluorinated graphene layers of the interconnects. Thus, it may be possible to utilize a variety of dielectric materials with graphene interconnects while maintaining the desirable conductive characteristics of the nonfluorinated graphene.

Figure 4A:
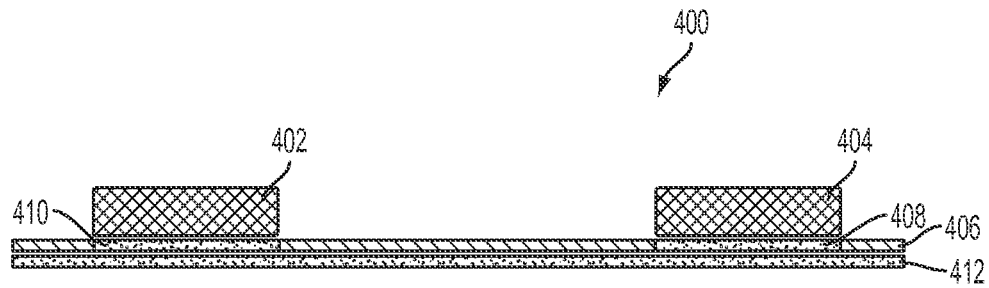
FIGS. 4A-C schematically illustrate cross-section side views of graphene and fluorinated graphene used as a tunnel barrier, in accordance with some embodiments.
Figure 4B:
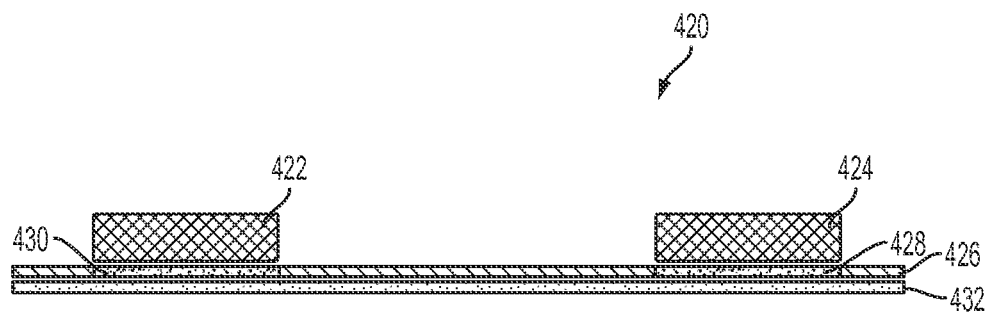
Figure 4C:

FIGS. 4A-C illustrate cross-section side views of graphene and fluorinated graphene used as a tunnel barrier, for example in a lateral local or non-local spin valve device. FIG. 4A shows an assembly 400 including two gate electrodes 402, 404. Gate electrodes 402, 404 may be similar to gate electrodes discussed previously, and in the case of a spin-based device would likely consist of a ferromagnetic metal or other material capable of injecting more electrons of one spin type relative to another. The assembly 400 may also include a layer of fluorinated graphene 406 with regions of nonfluorinated graphene 408, 410 located adjacent the gate electrodes 402, 404. This arrangement may be formed by forming the gate electrodes 402, 404 prior to fluorinating layer 406. In this manner, the gate electrodes 402, 404 may serve as a mask for regions 408, 410 during the fluorinating operation, preventing regions 408 and 410 from becoming fluorinated. The assembly 400 may further include a nonfluorinated graphene layer 412. The nonfluorinated graphene layer 412 may serve as a charge or spin channel of a charge-based transistor device or spin-based local or non-local spin valve device.

FIG. 4B shows an assembly 420 including two gate electrodes 422, 424. Gate electrodes 422, 424 may be similar to gate electrodes discussed previously. Similar to assembly 400 of FIG. 4A, the assembly 420 may also include a layer of fluorinated graphene 426 with regions of nonfluorinated graphene 428, 430 located adjacent to the gate electrodes 422, 424. This arrangement may be formed as discussed above with reference to FIG. 4A. Unlike, assembly 400, assembly 420 does not include a nonfluorinated graphene layer. Rather assembly 420 may include a layer of conductive material 432. Conductive material 432 may include a semiconductor such as Si for a spin channel or a metal such as Cu for a spin channel or another 2D material such as MoS2 for a spin channel. The conductive material 432 may serve as a charge or spin channel of a charge-based transistor or spin-based local or non-local spin valve device. Thus, in some embodiments graphene (fluorinated or non-fluorinated) may be used as a tunnel barrier even though other materials are used to form the channels.

FIG. 4C shows an assembly 440 including two gate electrodes 442, 444. Gate electrodes 442, 444 may be similar to gate electrodes discussed previously, and in the case of a spin-based device would likely consist of a ferromagnetic metal or other material capable of injecting more electrons of one spin type relative to another. The assembly 440 may also include a layer of fluorinated graphene 446 located adjacent the gate electrodes 442, 444. Unlike assembly 400 of FIG. 4A, in assembly 440, the regions 449 and 450 adjacent the gate electrodes 442, 444 are fluorinated. In this manner, the fluorinated graphene of layer 446 may form a tunnel barrier for a device. This arrangement may be formed by forming the gate electrodes 442, 444 after fluorinating layer 446. The assembly 440 may further include a nonfluorinated graphene layer 452. The nonfluorinated graphene layer 452 may serve as a charge or spin channel of a charge-based transistor device or spin-based local or non-local spin valve device.

Figure 5:
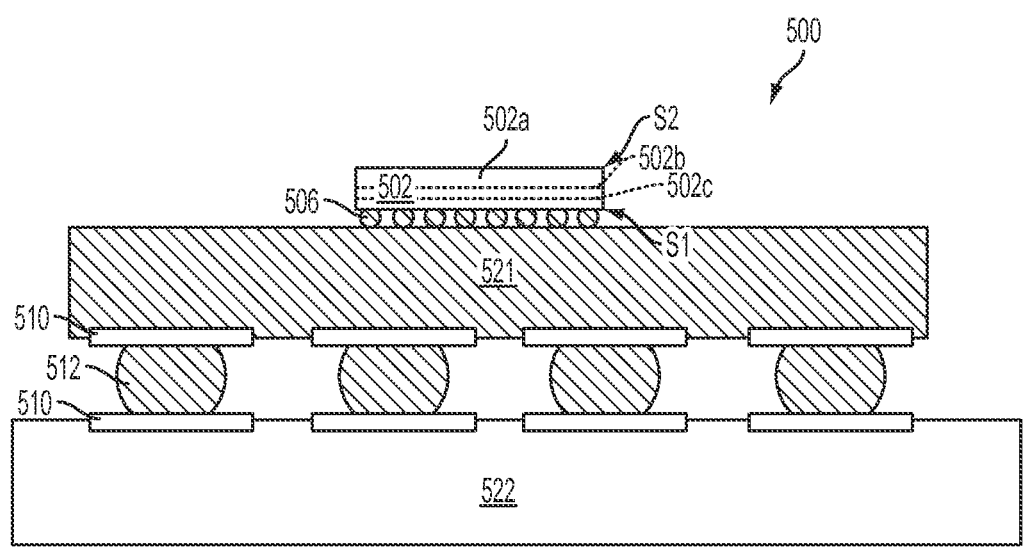
FIG. 5 schematically illustrates a cross-section side view of an integrated circuit (IC) assembly, in accordance with some embodiments.

FIG. 5 illustrates a cross-section side view of an integrated circuit (IC) assembly 500, in accordance with some embodiments. In some embodiments, the IC assembly 500 may include one or more dies (hereinafter "die 502") electrically and/or physically coupled with a package substrate 521. In some embodiments, the package substrate 521 may be electrically coupled with a circuit board 522, as can be seen.

The die 502 may represent a discrete product made from a semiconductor material (e.g., silicon) using semiconductor fabrication techniques such as thin film deposition, lithography, etching and the like used in connection with forming CMOS devices. In some embodiments, the die 502 may be, include, or be a part of a processor, memory, SoC or ASIC in some embodiments. In some embodiments, an electrically insulative material such as, for example, molding compound or underfill material (not shown) may encapsulate at least a portion of the die 502 and/or die-level interconnect structures 506.

The die 502 can be attached to the package substrate 521 according to a wide variety of suitable configurations including, for example, being directly coupled with the package substrate 521 in a flip-chip configuration, as depicted. In the flip-chip configuration, an active side, S1, of the die 502 including circuitry is attached to a surface of the package substrate 521 using die-level interconnect structures 506 such as bumps, pillars, or other suitable structures that may also electrically couple the die 502 with the package substrate 521. The active side S1 of the die 502 may include multi-threshold voltage transistor devices as described herein. An inactive side, S2, may be disposed opposite to the active side S1, as can be seen.

The die 102 may generally include a semiconductor substrate 502a, one or more device layers (hereinafter "device layer 502b") and one or more interconnect layers (hereinafter "interconnect layer 502c"). The semiconductor substrate 502a may be substantially composed of a bulk semiconductor material such as, for example silicon, in some embodiments. The device layer 502b may represent a region where active devices such as transistor devices are formed on the semiconductor substrate. The device layer 502b may include, for example, structures such as graphene assemblies (e.g., 100, 110, 120, 130, 140, 200, 210 discussed above) and/or source/drain regions of transistor devices. The interconnect layer 502c may include interconnect structures that are configured to route electrical signals or spin information to or from the active devices (which may be charge or spin based devices) in the device layer 502b. For example, the interconnect layer 502c may include trenches and/or vias to provide electrical routing and/or contacts. In some embodiments, assemblies, such as 300, 320 may be used as interconnect structures and formed as part of interconnect layer 502c. Gate electrode structures, as shown in various previous figures may be disposed between and electrically couple the transistor devices of the device layer 502b and the interconnect structures of the interconnect layer 502c.

In some embodiments, the die-level interconnect structures 506 may be configured to route electrical signals between the die 502 and other electrical devices. The electrical signals may include, for example, input/output (I/O) signals and/or power/ground signals that are used in connection with operation of the die 502.

In some embodiments, the package substrate 521 is an epoxy-based laminate substrate having a core and/or build-up layers such as, for example, an Ajinomoto Build-up Film (ABF) substrate. The package substrate 521 may include other suitable types of substrates in other embodiments including, for example, substrates formed from glass, ceramic, or semiconductor materials.

The package substrate 521 may include electrical routing features configured to route electrical signals to or from the die 502. The electrical routing features may include, for example, pads or traces (not shown) disposed on one or more surfaces of the package substrate 521 and/or internal routing features (not shown) such as, for example, trenches, vias or other interconnect structures to route electrical signals through the package substrate 521. For example, in some embodiments, the package substrate 521 may include electrical routing features such as pads (not shown) configured to receive the respective die-level interconnect structures 506 of the die 502.

The circuit board 522 may be a printed circuit board (PCB) composed of an electrically insulative material such as an epoxy laminate. For example, the circuit board 522 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 502 through the circuit board 522. The circuit board 522 may be composed of other suitable materials in other embodiments. In some embodiments, the circuit board 522 is a motherboard (e.g., motherboard 902 of FIG. 9).

Package-level interconnects such as, for example, solder balls 512 may be coupled to one or more pads (hereinafter "pads 510") on the package substrate 521 and/or on the circuit board 522 to form corresponding solder joints that are configured to further route the electrical signals between the package substrate 521 and the circuit board 522. The pads 510 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 521 with the circuit board 522 may be used in other embodiments.

The IC assembly 500 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 502 and other components of the IC assembly 500 may be used in some embodiments.

Figure 6:
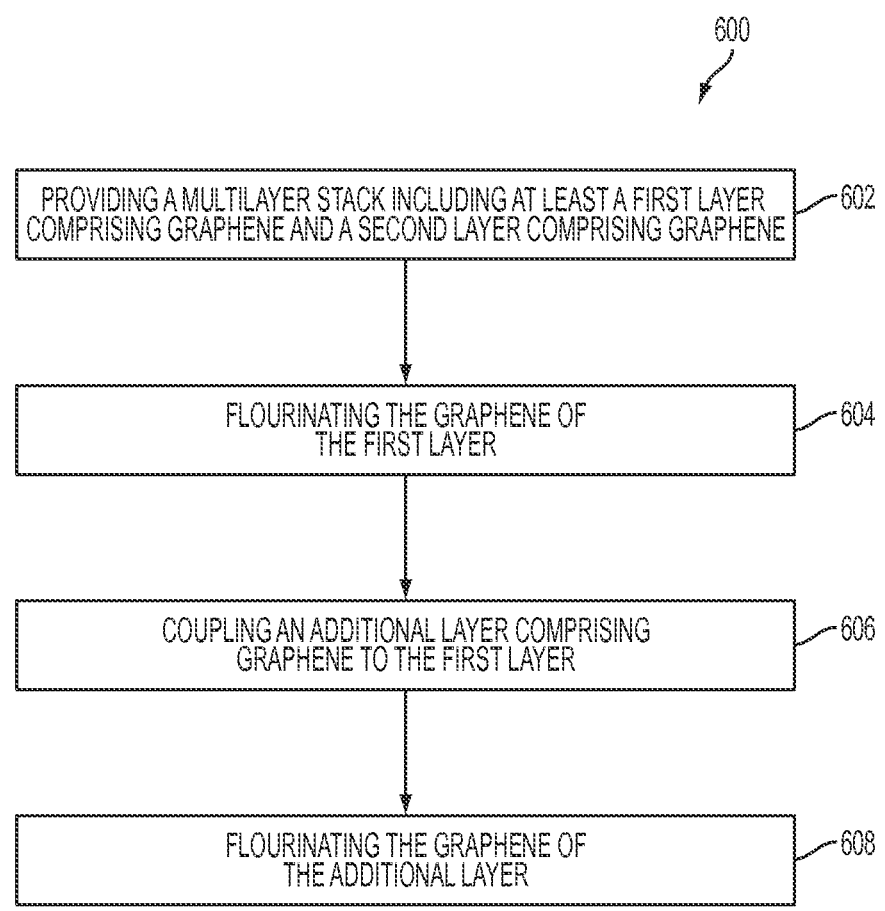
FIG. 6 schematically illustrates a flow diagram for a method of fabricating a graphene assembly, in accordance with some embodiments.

FIG. 6 illustrates a flow diagram for a method 600 of fabricating a graphene assembly, in accordance with some embodiments. The method 600 may begin at 602 with providing a multilayer stack including at least a first layer and second layer each comprising graphene. This may include depositing the second layer comprising graphene on a substrate by chemical vapor deposition (CVD) and coupling the first layer comprising graphene to the second layer comprising graphene. In some instances this may include growth of graphene layers by CVD followed by transfer by either wet or dry transfer methods to a final target substrate. This may include single layer graphene growth on separate growth substrate with multiple transfers to build up a multilayer stack on a target substrate. In other embodiments this may include multilayer graphene growth on a separate growth substrate with single transfer step to a target substrate. In some embodiments this operation may include direct growth of graphene on a target substrate. Furthermore such techniques may be combined to form stacks of graphene layers consistent with the various embodiments discussed above.

The method 600 may continue at 604 with fluorinating the graphene of the topmost layer of an exposed graphene stack. This may include exposing the top layer to a material including fluorine including, but not limited to, xenon fluoride ($XeF_2$) or carbon fluoride ($CF_4$), CHF3, or SF6 plasma. In some embodiments, operation 604 may only fluorinate the topmost layer of graphene in order to leave a multilayer stack of nonfluorinated graphene layers under a fluorinated topmost graphene layer. For instance, in forming assembly 120 of FIG. 1C, three nonfluorinated layers 126, 128, and 129 remain after performing operating 604 to the stack of layers 124, 126, 128, and 129, which in this case fluorinates the topmost layer 124 without fluorinating any of the bottom three layers 126, 128, and 129. For embodiments requiring more than one fluorinated graphene layer, e.g. FIG. 1E, operation 606 is performed and followed up by operation 608 if needed in order to fluorinate the uppermost layer (i.e., 146). In this way, by repeating operation 606 and if needed 608, assembly 140 can be built up layer by layer. As such by selectively skipping or repeating certain operations, it may be possible to form graphene assemblies, having a wide variety of structures and varying numbers of layers.

The method 600 may continue at 606 with coupling an additional layer comprising graphene to the first layer. The method 600 may continue at 608 with fluorinating the graphene of the additional layer. This may include exposing the additional layer to a material including fluorine including, but not limited to, xenon fluoride ($XeF_2$) or carbon fluoride ($CF_4$). Operations 606 and 608 if needed may be repeated to form additional nonfluorinated or fluorinated graphene layers as desired. In other embodiments, as discussed below, layers may fluorinated prior to coupling such that fluorinated graphene layers may be coupled to fluorinated or nonfluorinated layers of the multilayer stack.

Figure 7:
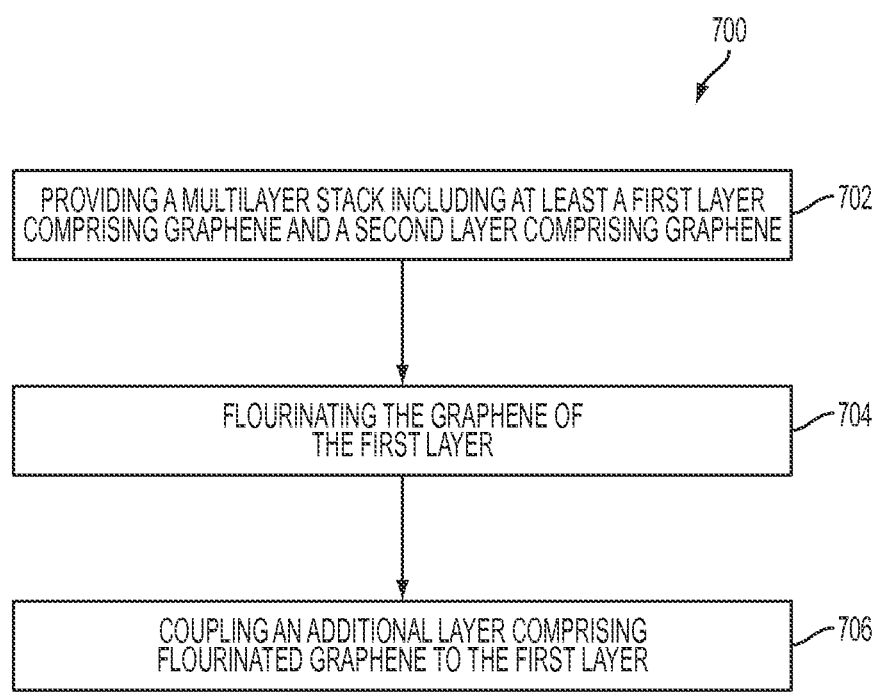
FIG. 7 schematically illustrates a flow diagram for a method of fabricating a graphene assembly, in accordance with some embodiments.

FIG. 7 illustrates a flow diagram for a method 700 of fabricating a graphene assembly, in accordance with some embodiments. The method 700 may begin at 702 with providing a multilayer stack including at least a first layer and second layer each comprising graphene. This may include depositing the second layer comprising graphene on a substrate by chemical vapor deposition; and coupling the first layer comprising graphene to the second layer comprising graphene as discussed above with reference to FIG. 6.

The method 700 may continue at 704 with fluorinating the graphene of the first layer. This may include exposing the top layer to a material including fluorine including, but not limited to, xenon fluoride ($XeF_2$) or carbon fluoride ($CF_4$). In some embodiments, operation 704 may not be completed to leave a multilayer stack of nonfluorinated graphene layers, as discussed above.

The method 700 may continue at 706 with coupling an additional layer comprising fluorinated graphene to the first layer. This may include coupling more than one additional layer comprising fluorinated graphene to the first layer. For instance, when operation 704 is completed, followed by the coupling of two layers comprising fluorinated graphene in operation 706, the multilayer stack shown in assembly 110 of FIG. 1B may be formed. Alternatively, if operation 704 is not completed, such that operation 702 is followed by the coupling of two layers comprising fluorinated graphene in operation 706, the multilayer stack shown in assembly 130 of FIG. 1D may be formed. In some instances it may be more efficient to fluorinate the graphene prior to coupling it to the multilayer stack. For instance, it may be possible to fluorinate two layers of graphene simultaneously by exposing both sides (e.g., both layers) to a material containing fluorine during the same process as opposed to building up one layer at a time. Thus, in instances where multiple layers of fluorinated graphene are to be used, it may be useful to separately form a stack (e.g., two layers) of fluorinated graphene which can then be coupled to a different stack containing layers fluorinated or nonfluorinated graphene. This technique may be used in forming and coupling layers such as layers 114, 116 of FIG. 1 B, layers 134, 136 of FIG. 1D, and layers 144, 146 of FIG. 1E.

Figure 8:
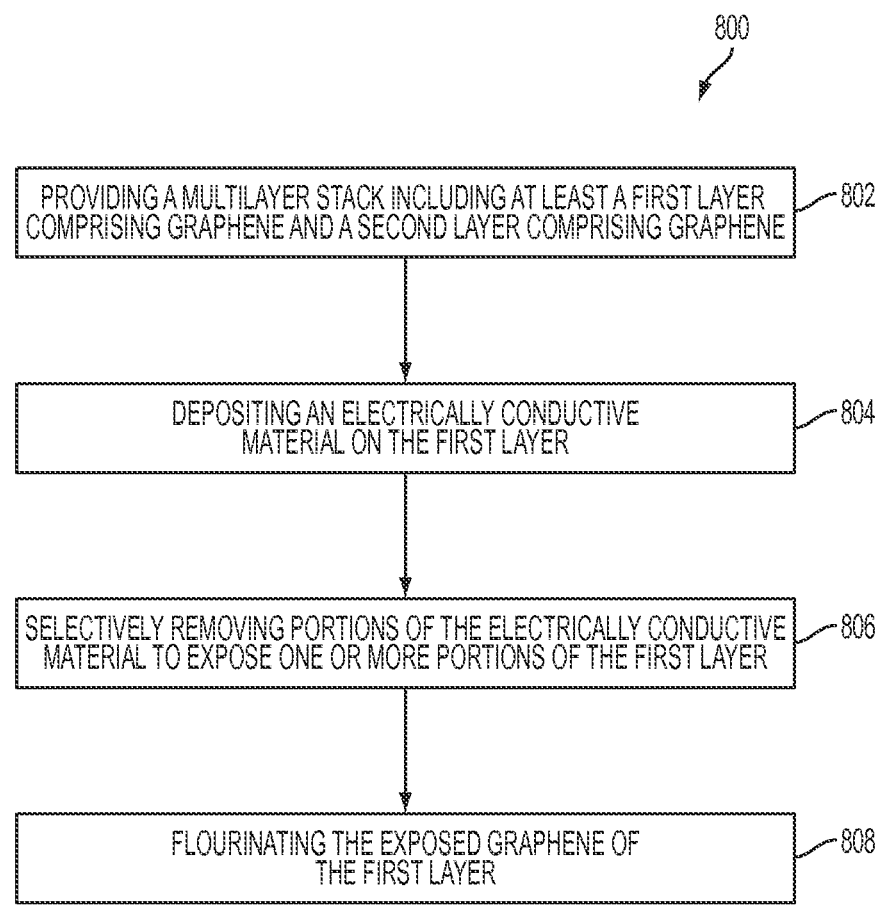
FIG. 8 schematically illustrates a flow diagram for a method of fabricating a graphene assembly including selectively fluorinated regions, in accordance with some embodiments.

FIG. 8 illustrates a flow diagram for a method 800 of fabricating a graphene assembly, in accordance with some embodiments. The method 800 may begin at 802 with providing a multilayer stack including at least a first layer and second layer each comprising graphene. This may include depositing the second layer comprising graphene on a substrate by chemical vapor deposition; and coupling the first layer comprising graphene to the second layer comprising graphene as discussed above with reference to FIG. 6.

The method 800 may continue at 804 with depositing an electrically conductive material on the first layer. This may include depositing a gate electrode material to form a gate of a transistor device. The gate electrode material may be composed of any suitable electrically conductive material including, for example, one or more metals such as, for example, workfunction metals.

The method 800 may continue at 806 with selectively removing portions of the electrically conductive material to expose one or more portions of the first layer. This may include a photo process and/or an etching process or any other suitable technique.

The method 800 may continue at 808 with fluorinating the exposed graphene of the topmost layer. This may be similar to other fluorinating operations discussed previously. In this instance only the exposed portions of the first layer may be fluorinated, leaving the portions of the first layer covered by the electrically conductive material nonfluorinated. In this manner the electrically conductive material may serve as a mask for the fluorination operation. This may provide a technique for forming graphene tunnel barriers (e.g., 408, 410 in FIG. 4A) between a gate and a nonfluorinated graphene layer (e.g., 412 in FIG. 4A). The nonfluorinated graphene layer (e.g., 412 in FIG. 4A) may serve as a charge channel or a spin channel for a charge-based or spin-based device, respectively.

Figure 9:
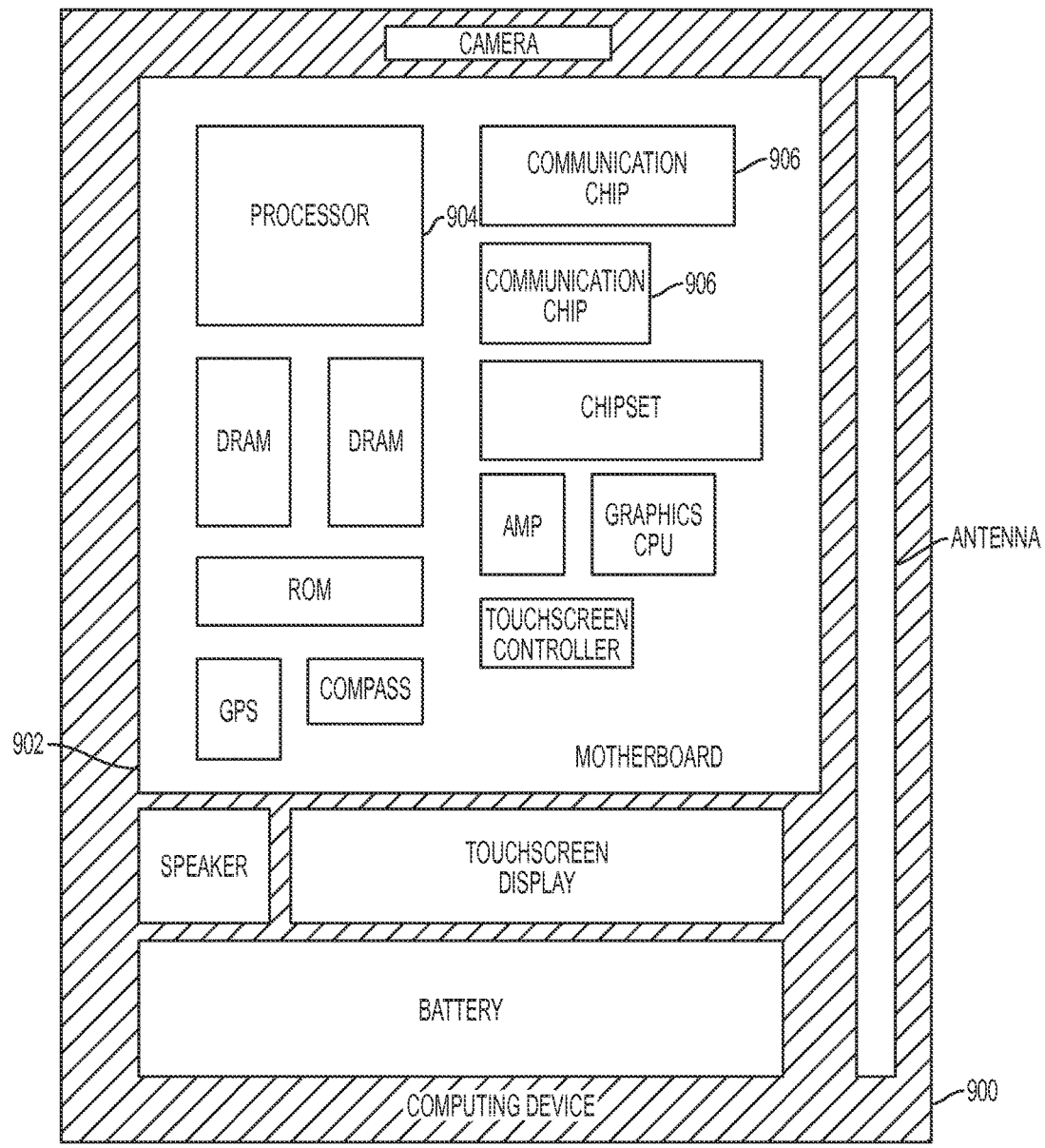
FIG. 9 schematically illustrates an example system that may include a graphene structure as described herein, in accordance with some embodiments.

FIG. 9 schematically illustrates an example system (e.g., computing device 900) that may include a graphene assembly or a die containing a graphene assembly as described herein, in accordance with some embodiments. The motherboard 902 may include a number of components, including but not limited to a processor 904 and at least one communication chip 906. The processor 904 may be physically and electrically coupled to the motherboard 902. In some implementations, the at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 may include a graphene assembly or a die containing a graphene assembly as described herein, in accordance with some embodiments. For example, the die 502 of FIG. 5 may be mounted in a package assembly that is mounted on the motherboard 902. The term "processor" may refer to any device or portion of a device that processes electronic data from registers and/or memory to transform that electronic data into other electronic data that may be stored in registers and/or memory.

The communication chip 906 may also include a graphene assembly or a die containing a graphene assembly as described herein, in accordance with some embodiments. In further implementations, another component (e.g., memory device or other integrated circuit device) housed within the computing device 900 may contain a graphene assembly or a die containing a graphene assembly as described herein.

In various implementations, the computing device 900 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Various operations are described as multiple discrete operations in turn, in a manner that is most helpful in understanding the claimed subject matter. However, the order of description should not be construed as to imply that these operations are necessarily order dependent.

EXAMPLES

Some non-limiting examples are provided below.

Example 1 includes an assembly for use in an integrated circuit, the assembly comprising: a first layer comprising graphene; and a second layer comprising of fluorinated graphene disposed directly on the first layer comprising graphene.

Example 2 includes the assembly of example 1, wherein the first layer comprising graphene is disposed directly on a third layer comprising graphene.

Example 3 includes the assembly of example 1, further comprising a third layer comprising fluorinated graphene disposed directly on the second layer of fluorinated graphene.

Example 4 includes the assembly of example 1, further comprising a third layer comprising graphene disposed directly on the second layer of fluorinated graphene.

Example 5 includes the assembly of example 1, further comprising a layer of electrically insulative material disposed on the second layer of fluorinated graphene.

Example 6 includes the assembly of example 5, further comprising an electrically conductive material disposed on the layer of electrically insulative material.

Example 7 includes the assembly of example 5, further comprising an additional layer comprising fluorinated graphene disposed on the layer of electrically insulative material.

Example 8 includes the assembly of example 7, further comprising an additional layer comprising graphene disposed on the additional layer comprising fluorinated graphene.

Example 9 includes a die comprising: a semiconductor substrate; a layer comprising graphene disposed on the semiconductor substrate; and a layer comprising fluorinated graphene disposed directly on the first layer comprising graphene.

Example 10 includes the die of example 9, further comprising a gate electrode disposed on the layer comprising fluorinated graphene.

Example 11 includes the die of example 10, wherein a region of the layer comprising fluorinated graphene disposed adjacent to an outer surface of the gate electrode comprises predominately non-fluorinated graphene.

Example 12 includes the die of example 10, further comprising a gate dielectric disposed between the layer comprising fluorinated graphene and the gate electrode.

Example 13 includes the die of example 11, wherein the gate dielectric is disposed directly on the layer comprising fluorinated graphene, the apparatus further comprising an additional layer comprising fluorinated graphene disposed between the gate dielectric and the gate electrode.

Example 14 includes the die of any of examples 10-13, wherein the gate electrode is formed from at least one additional layer comprising graphene.

Example 15 includes the die of example 9, wherein the layer comprising graphene serves as a channel of a transistor device and the layer comprising fluorinated graphene serves as a gate dielectric of the transistor device.

Example 16 includes the die of example 9, wherein: the die includes a device layer disposed on the semiconductor substrate; the device layer includes one or more transistor devices; the die includes an interconnect layer disposed on the device layer; the layer comprising graphene is disposed in the interconnect layer and configured to route electrical signals of the one or more transistor devices.

Example 17 includes the die of example 16, further comprising a low-k dielectric material disposed on the layer comprising fluorinated graphene, wherein the low-k dielectric materials is disposed between the layer comprising fluorinated graphene and an additional interconnect layer.

Example 18 includes a method of fabricating an assembly, the method comprising: providing a multilayer stack including a first layer comprising graphene disposed directly on a second layer comprising graphene; and fluorinating the graphene of the first layer comprising graphene.

Example 19 includes the method of example 18, wherein providing a multilayer stack includes: depositing the second layer comprising graphene on a substrate by chemical vapor deposition; and coupling the first layer comprising graphene to the second layer comprising graphene.

Example 20 includes the method of example 18, further comprising: coupling an additional layer comprising graphene to the first layer comprising graphene.

Example 21 includes the method of example 20, further comprising: fluorinating the graphene of the additional layer comprising graphene Example 22 includes method of example 18, further comprising: coupling an additional layer comprising fluorinated graphene to the first layer comprising graphene.

Example 23 includes method of example 18, further comprising: depositing an electrically conductive material on the first layer comprising graphene prior to fluorinating the graphene of the first layer, and selectively removing portions of the electrically conductive material to expose one or more portions of the first layer comprising graphene prior to fluorinating the graphene of the first layer, wherein the electrically conductive material prevents the portions of the first layer comprising graphene covered by the electrically conductive material from being fluorinated during said fluorinating the graphene of the first layer.

Example 24 includes computing device, comprising: a circuit board; and a die coupled with the circuit board, the die including: a semiconductor substrate; a layer comprising graphene disposed on the semiconductor substrate; and a layer comprising fluorinated graphene disposed directly on the layer comprising graphene.

Example 25 includes computing device of example 24, wherein the die is a processor; and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments, including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An assembly for use in an integrated circuit, the assembly comprising:
   a first layer comprising graphene;
   a second layer comprising fluorinated graphene directly on the first layer comprising graphene;
   a layer of electrically insulative material on the second layer of fluorinated graphene; and
   an additional layer comprising fluorinated graphene on the layer of electrically insulative material.

2. The assembly of claim 1, wherein the first layer comprising graphene is directly on a third layer comprising graphene.

3. The assembly of claim 1, further comprising an electrically conductive material on the additional layer comprising fluorinated graphene.

4. The assembly of claim 1, further comprising an additional layer comprising graphene on the additional layer comprising fluorinated graphene.

5. The assembly of claim 1, wherein the layer of electrically insulative material is directly on the second layer of fluorinated graphene, and the additional layer comprising fluorinated graphene is directly on the layer of electrically insulative material.

6. A die comprising:
   a semiconductor substrate;
   a device layer on the semiconductor substrate, wherein the device layer includes one or more transistor devices;
   an interconnect layer on the device layer;
   a layer comprising graphene in the interconnect layer and configured to route electrical signals of the one or more transistor devices; and
   a layer comprising fluorinated graphene directly on the layer comprising graphene.

7. The die of claim 6, further comprising a gate electrode on the layer comprising fluorinated graphene.

8. The die of claim 7, wherein a region of the layer comprising fluorinated graphene adjacent to an outer surface of the gate electrode comprises predominately non-fluorinated graphene.

9. The die of claim 7, further comprising a gate dielectric between the layer comprising fluorinated graphene and the gate electrode.

10. The die of claim 9, wherein the gate dielectric is directly on the layer comprising fluorinated graphene, the die further comprising an additional layer comprising fluorinated graphene between the gate dielectric and the gate electrode.

11. The die of claim 7, wherein the gate electrode is formed from at least one additional layer comprising graphene.

12. The die of claim 6, wherein the layer comprising graphene serves as a channel of a transistor device and the layer comprising fluorinated graphene serves as a gate dielectric of the transistor device.

13. The die of claim 6, further comprising a low-k dielectric material on the layer comprising fluorinated graphene, wherein the low-k dielectric materials is between the layer comprising fluorinated graphene and an additional interconnect layer.

14. A method of fabricating an assembly, the method comprising:
   providing a multilayer stack including a first layer comprising graphene directly on a second layer comprising graphene;
   fluorinating the graphene of the first layer comprising graphene;
   forming a layer of electrically insulative material on the first layer comprising graphene; and
   coupling an additional layer comprising fluorinated graphene to the layer of electrically insulative material.

15. The method of claim 14, wherein providing a multilayer stack includes:
   depositing the second layer comprising graphene on a substrate by chemical vapor deposition; and
   coupling the first layer comprising graphene to the second layer comprising graphene.

16. The method of claim 14, further comprising:
   depositing an electrically conductive material on the first layer comprising graphene prior to fluorinating the graphene of the first layer; and
   selectively removing portions of the electrically conductive material to expose one or more portions of the first layer comprising graphene prior to fluorinating the graphene of the first layer,
   wherein the electrically conductive material prevents the portions of the first layer comprising graphene covered by the electrically conductive material from being fluorinated during said fluorinating the graphene of the first layer.

17. A computing device, comprising:
   a circuit board; and
   a die coupled with the circuit board, the die including:
      a semiconductor substrate;
      a first layer comprising graphene on the semiconductor substrate;
      a second layer comprising fluorinated graphene directly on the layer comprising graphene;
      a third layer of electrically insulative material directly on the second layer; and
      a fourth layer comprising fluorinated graphene directly on the third layer.

18. The computing device of claim 17, wherein
   the die is a processor; and
   the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and camera.

* * * * *